United States Patent
Liu et al.

(10) Patent No.: US 10,551,441 B2
(45) Date of Patent: Feb. 4, 2020

(54) METHOD AND SYSTEM FOR RELAY DIAGNOSIS

(71) Applicant: Contemporary Amperex Technology Co., Limited, Ningde, Fujian (CN)

(72) Inventors: Ping Liu, Ningde (CN); Chenling Zheng, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 198 days.

(21) Appl. No.: 15/720,216

(22) Filed: Sep. 29, 2017

(65) Prior Publication Data

US 2018/0113170 A1 Apr. 26, 2018

(30) Foreign Application Priority Data

Oct. 26, 2016 (CN) .......................... 2016 1 0943230

(51) Int. Cl.
*G01R 31/02* (2006.01)
*G01R 31/327* (2006.01)
*G01R 31/28* (2006.01)

(52) U.S. Cl.
CPC ..... *G01R 31/3278* (2013.01); *G01R 31/2841* (2013.01); *G01R 31/025* (2013.01)

(58) Field of Classification Search
CPC .. G01R 31/025; G01R 31/28; G01R 31/2841; G01R 31/2834; G01R 31/327;
(Continued)

(56) References Cited

U.S. PATENT DOCUMENTS 4,371,908 A * 2/1983 Andow .................... H02H 3/30
361/68
5,065,101 A * 11/1991 Ledbetter ........... G01R 31/3278
324/415
(Continued)

FOREIGN PATENT DOCUMENTS

CN 101823482 A 9/2010
CN 102340122 A 2/2012
(Continued)

OTHER PUBLICATIONS

Extended European Search Report for European Application No. 17194614.8, dated Mar. 26, 2018.
(Continued)

*Primary Examiner* — Thang X Le
(74) *Attorney, Agent, or Firm* — Law Offices of Liaoteng Wang (57) ABSTRACT

The present application discloses a method and a system for relay diagnosis. The method includes: transmitting a control signal to the relay, wherein types of the control signal include an enable signal and a disable signal; applying a detection signal at one side of the relay, and receiving a feedback signal at the other side of the relay; and comparing the detection signal with the feedback signal to obtain a comparison result, wherein if the comparison result matches the control signal, the relay is determined as being normal, otherwise, the relay is determined as fault. The present application simply needs to concern whether the relay being diagnosed is enabled or not, and compares the received feedback signal with the applied detection signal to realize the relay diagnosis, thereby avoiding the impacts from other devices in the relay circuit. Thus, the diagnostic efficiency and accuracy can be improved.

10 Claims, 6 Drawing Sheets

(58) Field of Classification Search
CPC ..... G01R 31/3278; G01N 2291/02836; H02M 1/32; H02M 1/36
See application file for complete search history.

(56) References Cited

U.S. PATENT DOCUMENTS

| | | | |
|---|---|---|---|
| 5,742,513 A * | 4/1998 | Bouhenguel ....... | G01R 31/3278 324/418 |
| 2013/0063102 A1 * | 3/2013 | Chen ................. | H02M 3/156 323/234 |
| 2014/0300481 A1 | 10/2014 | Overton et al. | |

FOREIGN PATENT DOCUMENTS

| | | |
|---|---|---|
| CN | 104330726 A | 2/2015 |
| CN | 105137336 A | 12/2015 |
| JP | H05336083 A | 12/1993 |
| JP | 2001035335 A | 2/2001 |

OTHER PUBLICATIONS

The first Office Action and search report for Chinese Application No. 201610943230.0, dated Sep. 25, 2019, 9 pages.

\* cited by examiner transmitting a control signal to the relay, and types of the control signal include an enable signal and a disable signal — S101 applying a detection signal at one side of the relay, and receiving the feedback signal at the other side of the relay — S102 comparing the detection signal with the feedback signal to obtain a comparison result, wherein if the comparison result matches the control signal, the relay is determined as being normal, otherwise, the relay is determined as fault — S103

METHOD AND SYSTEM FOR RELAY DIAGNOSIS

CROSS-REFERENCE TO RELATED APPLICATION

This application is based upon and claims priority to Chinese Patent Application No. 201610943230.0, filed on Oct. 26, 2016, the content of which is incorporated herein by reference in its entirety.

TECHNICAL FIELD

The present application relates to the technical field of relay, and more particularly to a method and a system for relay diagnosis.

BACKGROUND

In today's world, the energy crisis has received a growing concern from people all over the world. Conventional automobiles rely on non-renewable energy, such as gasoline, diesel and so on. At present, reserves of this kind of energy on earth have continuously decreased. More and more wars break out due to the energy crisis. The emergence of new energy automobile can effectively alleviate the energy crisis and achieve the sustainable development. Moreover, the environmental pollution has become an increasingly serious problem. The combustion of gasoline or diesel produces a large quantity of sulfide or particulate matter. These products will seriously pollute the atmosphere, and even worse, when encountering rain, the sulfide is easy to form acid rain, which will bring other pollution problems. As series of problems arise, there is an urgent demand on new energy industry and new energy automobile. At the same time, in order to vigorously promote the development of new energy automobiles, the government has introduced a series of high subsidy policies. These policies have played a positive role in the development of new energy automobiles, but also put forward higher and higher requirements on the new energy automobile technology. Especially the safety performance of the new energy automobile has always been the focus of people's attention. A relay serves as an element in a battery management system for controlling open and close each branches. When an open-circuit fault occurs in the relay, the fault will directly affect some functions to be unavailable to use. When an adhesion fault occurs in the relay, the relay cannot be opened such that a series of serious problems, such as overcharge, over discharge, over-temperature, etc. will be likely to arise. Therefore, it is important to accurately diagnose if there is an open-circuit or adhesion fault occurs in a high-voltage relay.

One of the disclosed methods for relay diagnosis is mainly used to detect the relay circuit. However, considering the relay circuit per se has other devices, this method has such a drawback that in case of the occurrence of faults in the other devices, the method is unable to diagnose the relay.

SUMMARY

A purpose of the present application is to provide a method and a system for relay diagnosis capable of diagnosing the relay per se.

In order to achieve the purpose noted above, the present application provides a method for relay diagnosis, including: transmitting a control signal to the relay, wherein types of the control signal include an enable signal and a disable signal; applying a detection signal at one side of the relay, and receiving a feedback signal at the other side of the relay; and comparing the detection signal with the feedback signal to obtain a comparison result, wherein if the comparison result matches the control signal, the relay is determined as being normal, otherwise, the relay is determined as fault.

In order to achieve the purpose noted above, the present application provides a system for relay diagnosis, including: a control signal transmitting module configured to transmit a control signal to the relay, wherein types of the control signal include an enable signal and a disable signal; a detection-feedback signal module configured to apply a detection signal at one side of the relay, and receive a feedback signal at the other side of the relay; and a diagnosis module configured to compare the detection signal with the feedback signal to obtain a comparison result, wherein if the comparison result matches the control signal, the relay is determined as being normal, otherwise, the relay is determined as fault.

BRIEF DESCRIPTION OF THE DRAWINGS

The method and system for relay diagnosis provided in the present application and the advantages thereof will be further described in detail below by way of specific embodiments and in conjunction with the accompanying drawings.

DETAILED DESCRIPTION

To clarify the purpose, technical solutions and advantages, the present application is described in detail below in conjunction with drawings and specific embodiments. It should be noted that the specific embodiments described in the specification are merely provided for explanation, and not for limitation.

Figure 1:
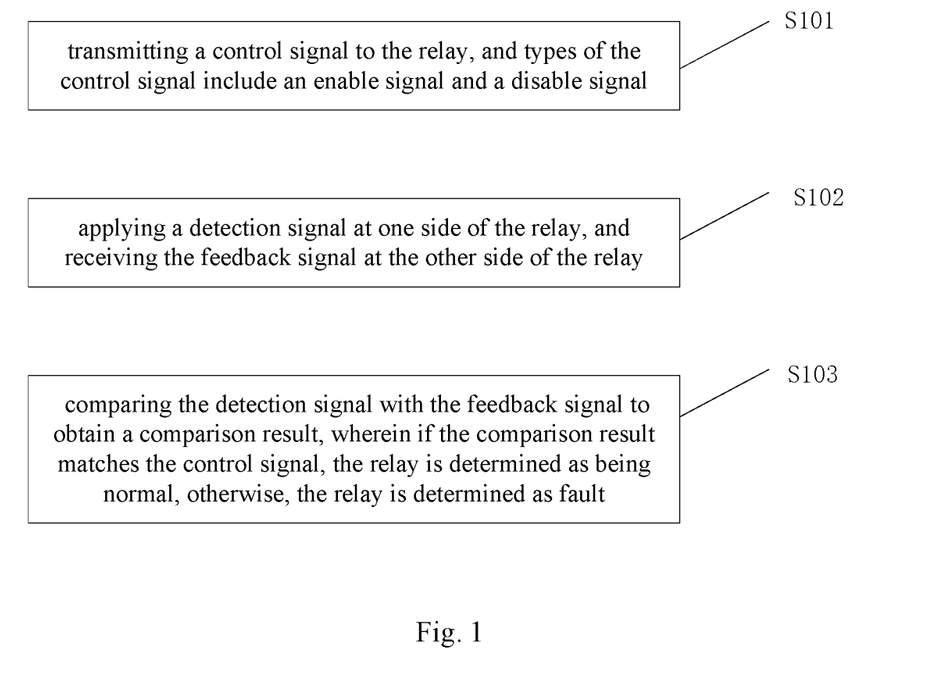
FIG. 1 is a flow chart of the method for relay diagnosis provided in the present application.

Referring to FIG. 1, which illustrates a flow chart of the method for relay diagnosis provided in the present application, including the following steps.

In step S101, transmitting a control signal to the relay, types of the control signal include an enable signal and a disable signal.

In step S102, applying a detection signal at one side of the relay, and receiving a feedback signal at the other side of the relay.

In step S103, comparing the detection signal with the feedback signal to obtain a comparison result. If the comparison result matches the control signal, the relay is determined as being normal; otherwise, the relay is determined as fault.

Figure 2:
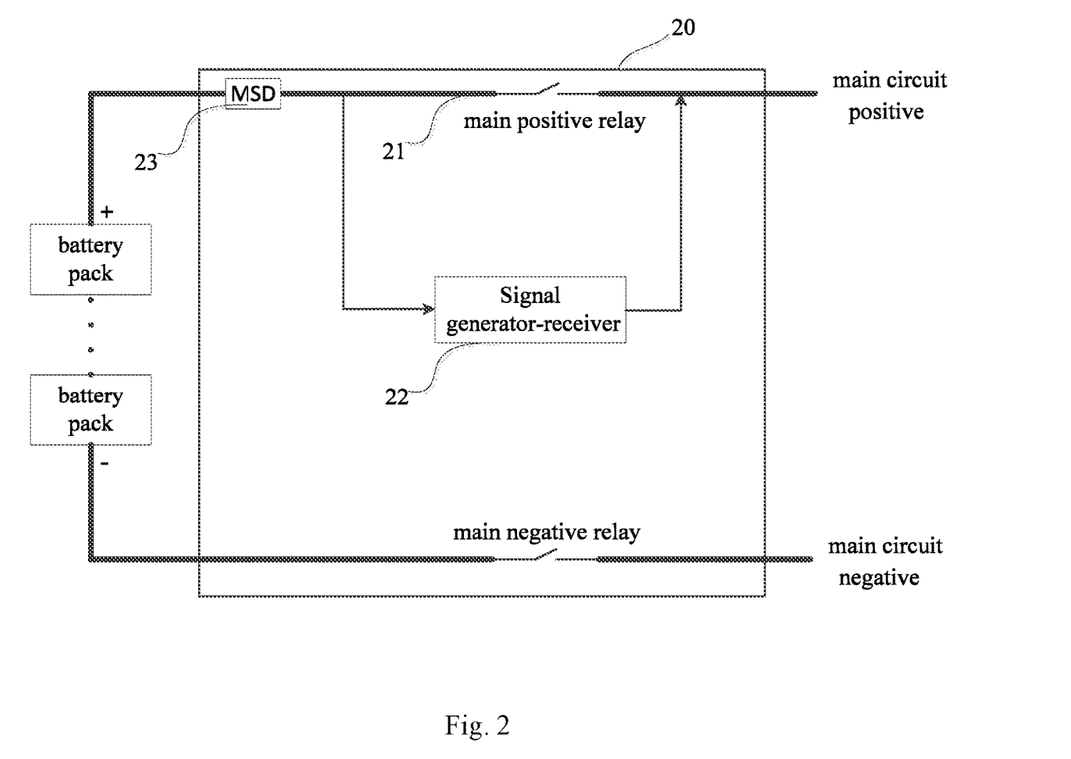
FIG. 2 is a circuit diagram of an embodiment of the method for relay diagnosis provided in the present application.

Reference is made to FIG. 2. In an embodiment of the method for relay diagnosis provided in the present application, the battery management system may perform the step S101 to transmit the control signal to control the opening and closing of the relay 21. In the embodiment, the relay 21 is a main positive relay provided in a high voltage box 20, which is disposed behind a MSD (Manual Service disconnect) 23 and used to control the opening and closing of each branches. A signal generator-receiver 22 applies the detection signal at one side of the relay 21, and receives the feedback signal at the other side of the relay 21. It should be noted that the present application is not limited by the type of the relay being diagnosed, which can be a main positive relay, a main negative relay, a charging positive relay, a charging negative relay, a heating relay or any other relay which employs the present application. In case of employing the battery management system, when the relay is required to be diagnosed if the adhesion fault occurs therein, the battery management system transmits the disable signal to open the relay 21, and controls the signal generator-receiver 22 to apply the detection signal, receive the feedback signal from the other side of the relay 21, and compare the received feedback signal with the applied detection signal, then the battery management system can determine if the adhesion fault occurs in the relay. When the relay 21 is required to be determined if the open-circuit fault occurs therein, the battery management system transmits the enable signal to close the relay 21, and controls the signal generator-receiver 22 to apply the detection signal and compare the received feedback signal with the detection signal, then the battery management system can determine if the open-circuit fault occurs in the relay. To sum up, the present application employs the battery management system to control the enable state of the relay and the signal generator-receiver to apply the detection signal, and then compare the received feedback signal with the detection signal so as to realize the purpose of diagnosing the adhesion or open-circuit fault for the relay.

In an embodiment of the method for relay diagnosis provided in the present application, if the comparison result matches the control signal, the relay is determined as being normal, otherwise, the relay is determined as fault, which particularly includes: if the comparison result is inconsistency and the control signal is the disable signal, then the comparison result matches the control signal and the relay is determined as being normal; if the comparison result is consistence and the control signal is the enable signal, then the comparison result matches the control signal and the relay is determined as being normal; if the comparison result is inconsistency and the control signal is the enable signal, then the comparison result does not match the control signal and the relay is determined as fault; and if the comparison result is consistence and the control signal is the disable signal, then the comparison result does not match the control signal and the relay is determined as fault.

Figure 3:
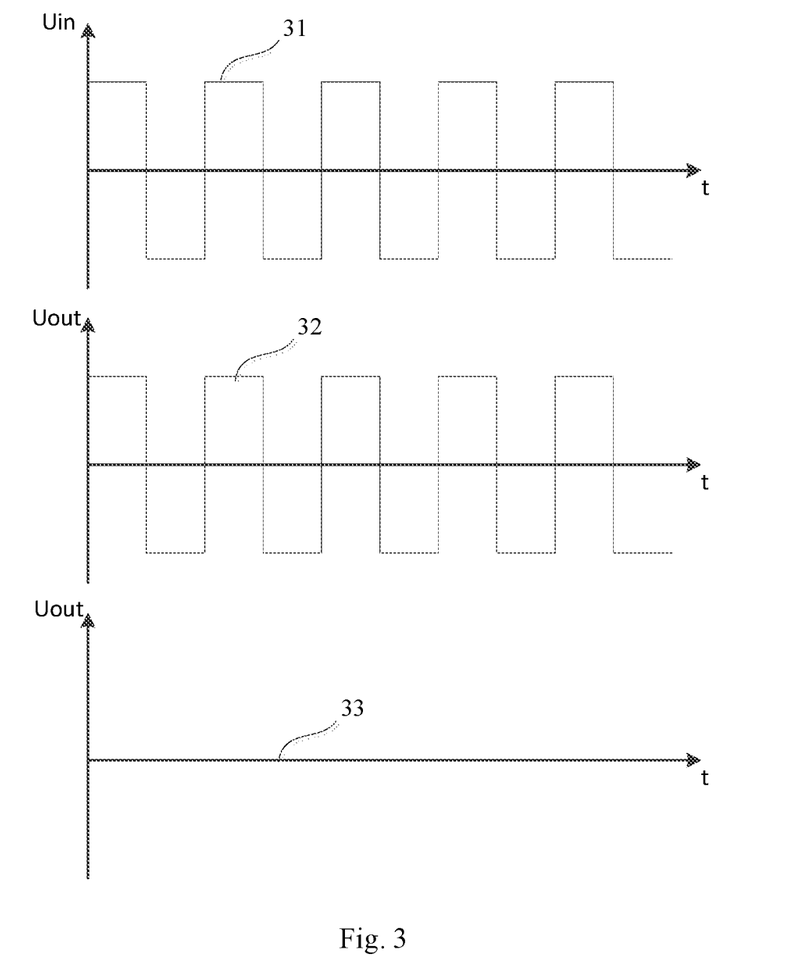
FIG. 3 is a comparison chart for the applied detection signal and the received feedback signal.

Reference is made to FIG. 3, which is a comparison chart for the applied detection signal and the received feedback signal. It should be noted that the present application does not limit the waveform of the detection signal, which may be a square wave, a pulse, a high level or even any waveform. When the battery management system transmits the disable signal to open the relay and controls the signal generator-receiver to apply the detection signal 31 as shown in FIG. 3, if the received feedback signal is as the feedback signal 32 shown in FIG. 3, the relay can be determined as fault; and if the received feedback is as the feedback signal 33 shown in FIG. 3, the relay can be determined as being normal. Similarly, when the battery management system transmits the enable signal to close the relay and controls the signal generator-receiver to apply the detection signal 31 as shown in FIG. 3, if the received feedback signal is as the feedback signal 32 shown in FIG. 3, the relay can be determined as being normal; and if the received feedback is as the feedback signal 33 shown in FIG. 3, the relay may be determined as fault. The form of the feedback signal used to determine whether there is a fault occurs in the relay is not limit to the form shown in FIG. 3, instead the form is determined based on the detection signal and the coupled manner. The present application does not limit in this respect.

In an embodiment of the method for relay diagnosis provided in the present invention, if the comparison result is inconsistency and the control signal is the enable signal, then the comparison result does not match the control signal and the relay is determined as fault, which particularly includes: if the comparison result is inconsistency and the control signal is the enable signal, then the comparison result does not match the control signal and the relay is determined as open-circuit fault; and if the comparison result is consistence and the control signal is the disable signal, then the comparison result does not match the control signal and the relay is determined as fault, which particularly includes: if the comparison result is consistence and the control signal is the disable signal, then the comparison result does not match the control signal and the relay is determined as adhesion fault.

Still referring to FIG. 3, when the relay is determined as adhesion fault, the battery management system transmits the disable signal to open the relay, and controls the signal generator-receiver to apply the detection signal 31 as shown in FIG. 3. In this case, if the received feedback signal is as the feedback signal 32 shown in FIG. 3, the relay is determined as adhesion fault; and if the received feedback signal is as the feedback signal 33 shown in FIG. 3, the relay is determined as adhesion fault-free. Similarly, when the relay is determined as open-circuit fault, the battery management system transmits the enable signal to close the relay, and controls the signal generator-receiver to apply the detection signal 31 as shown in FIG. 3. In this case, if the received feedback signal is as the feedback signal 32 shown in FIG. 3, the relay is determined as without open-circuit fault; and if the received feedback signal is as the feedback signal 33 shown in FIG. 3, the relay is determined as open-circuit fault-free. The form of the feedback signal used to determine whether there is an adhesion or open-circuit fault occurs in the relay is not limit to the form shown in FIG. 3, instead the form is determined based on the detection signal and the coupled manner. The present application does not limit in this respect.

In an embodiment of the method for relay diagnosis provided in the present application, the detection signal is applied on the inside or outside of the relay.

Figure 4:
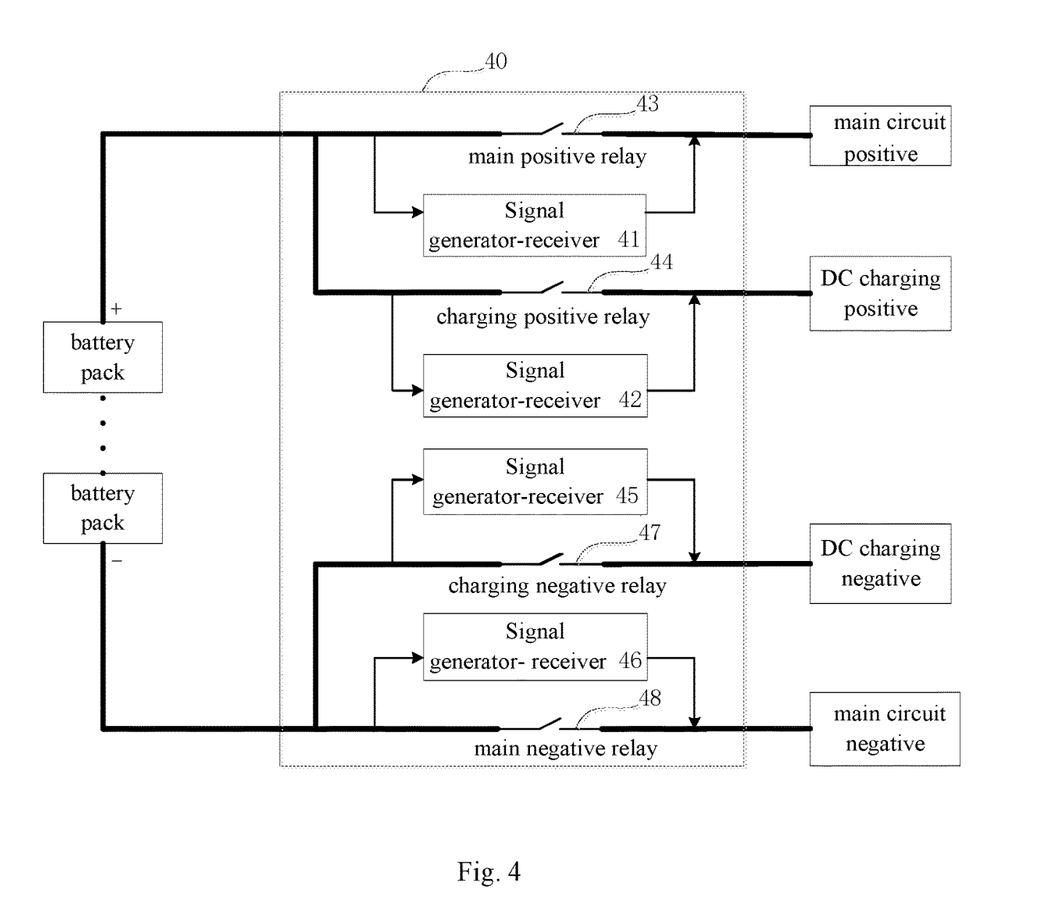
FIG. 4 is a circuit diagram of another embodiment of the method for relay diagnosis provided in the present application.

Reference is made to FIG. 4, in particular, the detection signal may be applied, by the signal generator-receivers 41 and 45, on the outside of the main positive relay 43 and the charging negative relay 47 within the high voltage box 40, and the feedback signal is received from the inside of the main positive relay 43 and the charging negative relay 47. Alternatively, the detection signal may be applied, by the signal generator-receivers 42 and 46, on the inside of the charging positive relay 44 and the main negative relay 48, and the feedback signal is received from the outside of the charging positive relay 44 and the main negative relay 48.

In an embodiment of the method for relay diagnosis provided in the present application, the detection signal is applied by a signal generator-receiver in parallel with the relay, and the feedback signal is received by the signal generator-receiver.

In an embodiment of the method for relay diagnosis provided in the present application, the detection signal is applied by a signal generator connected to one side of the relay, and the feedback signal is received by a signal receiver connected to the other side of the relay.

Figure 5:
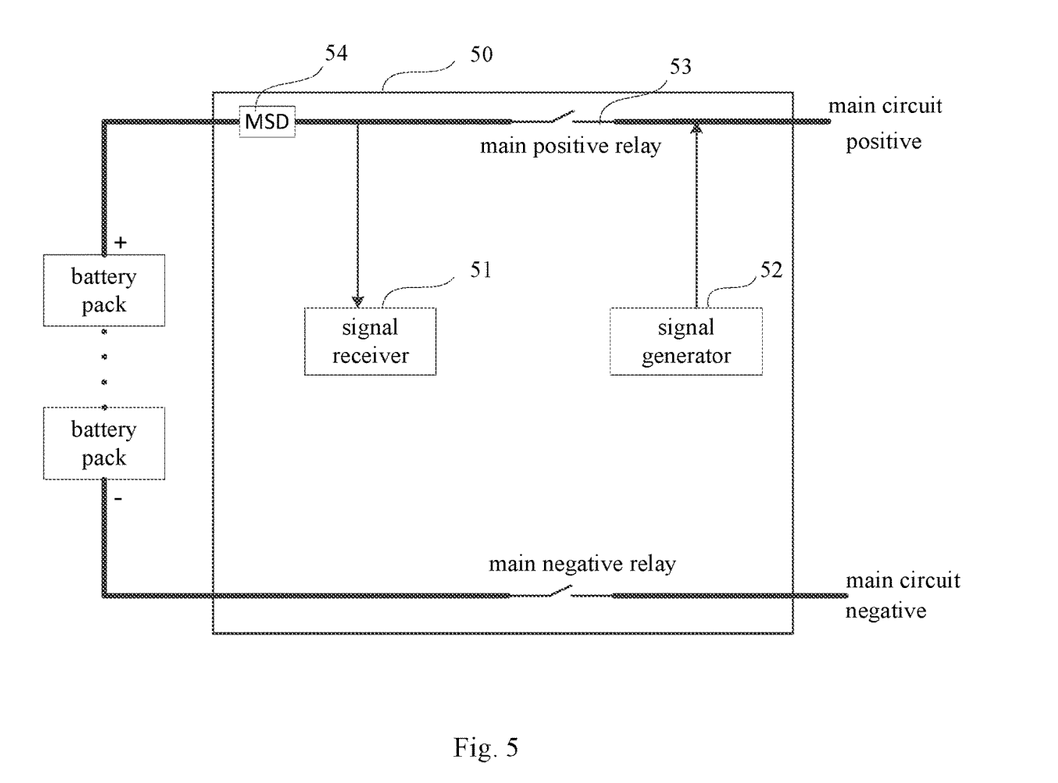
FIG. 5 is a circuit diagram of yet another embodiment of the method for relay diagnosis provided in the present application.

Reference is made to FIG. 5, a signal generator 51 applies the detection signal, while a signal receiver 52 receives the feedback signal, and diagnoses the relay 53 is diagnosed. In this case, the relay 53 is indicated to the main positive relay disposed behind a MSD 54 within the high voltage box 50.

Figure 6:
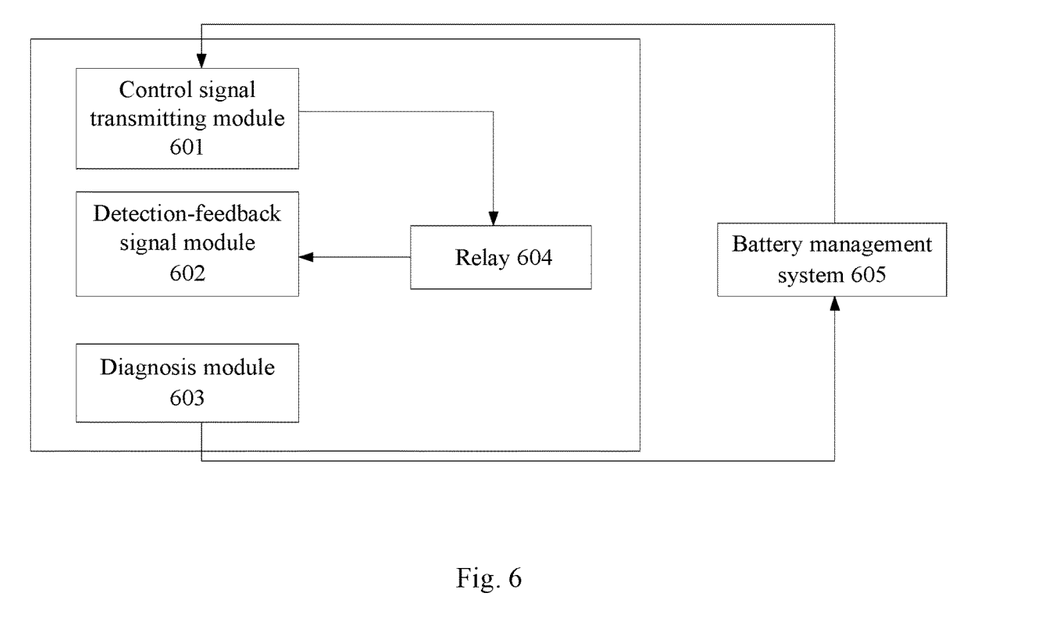
FIG. 6 is a system module diagram of the system for relay diagnosis provided in the present application.

Reference is made to FIG. 6, which is a system module diagram of the system for relay diagnosis provided in the present application. The system includes: a control signal transmitting module 601 configured to transmit the control signal to the relay 604, wherein types of the control signal include the enable signal and the disable signal; a detection-feedback signal module 602 configured to apply the detection signal at one side of the relay 604 and receive a feedback signal at the other side of the relay 604; and a diagnosis module 603 configured to compare the detection signal with the feedback signal to obtain a comparison result, wherein if the comparison result matches the control signal, the relay is determined as being normal, otherwise, the relay is determined as fault.

In particular, the battery management system 605 may inform the control signal transmitting module 601 to transmit the control signal, and the diagnosis module 603 returns the comparison result to the battery management system 605.

In an embodiment of the system for relay diagnosis provided in the present application, if the comparison result matches the control signal, the relay is determined as being normal, otherwise, the relay is determined as fault, which particularly includes: if the comparison result is inconsistency and the control signal is the disable signal, then the comparison result matches the control signal and the relay is determined as being normal; if the comparison result is consistence and the control signal is the enable signal, then the comparison result matches the control signal and the relay is determined as being normal; if the comparison result is inconsistency and the control signal is the enable signal, then the comparison result does not match the control signal and the relay is determined as fault; and if the comparison result is consistence and the control signal is the disable signal, then the comparison result does not match the control signal and the relay is determined as fault.

In an embodiment of the system for relay diagnosis provided in the present application, if the comparison result is inconsistency and the control signal is the enable signal, then the comparison result does not match the control signal and the relay is determined as fault, which particularly includes: if the comparison result is inconsistency and the control signal is the enable signal, then the comparison result does not match the control signal and the relay is determined as open-circuit fault; and if the comparison result is consistence and the control signal is the disable signal, then the comparison result does not match the control signal and the relay is determined as fault, which particularly includes: if the comparison result is consistence and the control signal is the disable signal, then the comparison result does not match the control signal and the relay is determined as adhesion fault.

In an embodiment of the system for relay diagnosis provided in the present application, the detection signal is applied on the inside or outside of the relay.

In an embodiment of the system for relay diagnosis provided in the present application, the detection-feedback signal module is a signal generator-receiver in parallel with the relay.

In an embodiment of the system for relay diagnosis provided in the present application, the detection-feedback signal module includes a signal generator connected to one side of the relay and a signal receiver connected to the other side of the relay, wherein the signal generator is configured to apply the detection signal at one side of the relay, and the signal receiver is configured to receive feedback signal at the other side of the relay.

To sum up, the method and system for relay diagnosis provided in the present application can realize the relay diagnosis by transmitting the control signal to the relay being diagnosed and comparing the received feedback signal with the applied detection signal.

The method and system for relay diagnosis provided in the present application can at least avoid the impacts from other devices in the relay circuit during the process of diagnosis, and thus improving the diagnostic efficiency and accuracy.

Various changes and modifications may be made by those skilled in the art, according to the disclosure and teaching of the foregoing descriptions. Thus, the specific implementations disclosed and described above are not intended to limit the present application. Any modifications and changes made to the present application are intended to be included within the claimed scope thereof. Although some specific terminologies are used in this specification, these terminologies are merely for convenience of illustration and are not intended to limit the present application.

What is claimed is:

1. A method for relay diagnosis, comprising:

transmitting a control signal to the relay, wherein types of the control signal comprise an enable signal and a disable signal for closing and opening the relay respectively;

applying a detection signal at one side of the relay, and receiving a feedback signal at the other side of the relay; and comparing the detection signal with the feedback signal to obtain a comparison result, wherein if the comparison result matches the control signal, the relay is determined as being normal, otherwise, the relay is determined as fault, wherein if the comparison result matches the control signal, the relay is determined as being normal, otherwise, the relay is determined as fault, particularly comprises:

if the comparison result is inconsistency and the control signal is the disable signal, then the comparison result matches the control signal and the relay is determined as being normal;

if the comparison result is consistence and the control signal is the enable signal, then the comparison result matches the control signal and the relay is determined as being normal;

if the comparison result is inconsistency and the control signal is the enable signal, then the comparison result does not match the control signal and the relay is determined as fault; and if the comparison result is consistence and the control signal is the disable signal, then the comparison result does not match the control signal and the relay is determined as fault.

2. The method for relay diagnosis of claim 1, wherein,
if the comparison result is inconsistency and the control signal is the enable signal, then the comparison result does not match the control signal and the relay is determined as fault, particularly comprises: if the comparison result is inconsistency and the control signal is the enable signal, then the comparison result does not match the control signal and the relay is determined as open-circuit fault; and
if the comparison result is consistence and the control signal is the disable signal, then the comparison result does not match the control signal and the relay is determined as fault, particularly comprises: if the comparison result is consistence and the control signal is the disable signal, then the comparison result does not match the control signal and the relay is determined as adhesion fault.

3. The method for relay diagnosis of claim 1, wherein the detection signal is applied on the inside or outside of the relay.

4. The method for relay diagnosis of claim 1, wherein the detection signal is applied by a signal generator-receiver in parallel with the relay, and the feedback signal is received by the signal generator-receiver.

5. The method for relay diagnosis of claim 1, wherein the detection signal is applied by a signal generator connected to one side of the relay, and the feedback signal is received by a signal receiver connected to the other side of the relay.

6. A system for relay diagnosis, comprising:
a control signal transmitting module configured to transmit a control signal to the relay, wherein types of the control signal comprise an enable signal and a disable signal for closing and opening the relay respectively;
a detection-feedback signal module configured to apply a detection signal at one side of the relay, and receive a feedback signal at the other side of the relay; and
a diagnosis module configured to compare the detection signal with the feedback signal to obtain a comparison result, wherein if the comparison result matches the control signal, the relay is determined as being normal, otherwise, the relay is determined as fault,
wherein if the comparison result matches the control signal, the relay is determined as being normal, otherwise, the relay is determined as fault particularly comprises:
if the comparison result is inconsistency and the control signal is the disable signal, then the comparison result matches the control signal, and the relay is determined as being normal;
if the comparison result is consistence and the control signal is the enable signal, then the comparison result matches the control signal and the relay is determined as being normal;
if the comparison result is inconsistency and the control signal is the enable signal, then the comparison result does not match the control signal and the relay is determined as fault; and
if the comparison result is consistence and the control signal is the disable signal, then the comparison result does not match the control signal and the relay is determined as fault.

7. The system for relay diagnosis of claim 6, wherein,
if the comparison result is inconsistency and the control signal is the enable signal, then the comparison result does not match the control signal and the relay is determined as fault, particularly comprises: if the comparison result is inconsistency and the control signal is the enable signal, then the comparison result does not match the control signal and the relay is determined as open-circuit fault; and
if the comparison result is consistence and the control signal is the disable signal, then the comparison result does not match the control signal and the relay is determined as fault, particularly comprises: if the comparison result is consistence and the control signal is the disable signal, then the comparison result does not match the control signal and the relay is determined as adhesion fault.

8. The system for relay diagnosis of claim 6, wherein the detection signal is applied on the inside or outside of the relay.

9. The system for relay diagnosis of claim 6, wherein the detection-feedback signal module is a signal generator-receiver in parallel with the relay.

10. The system for relay diagnosis of claim 6, wherein the detection-feedback signal module comprises: a signal generator connected to one side of the relay, and a signal receiver connected to the other side of the relay, wherein
the signal generator is configured to apply the detection signal at one side of the relay; and
the signal receiver is configured to receive the feedback signal at the other side of the relay.

* * * * *